United States Patent
Hasegawa

[11] Patent Number: 6,031,425
[45] Date of Patent: Feb. 29, 2000

[54] LOW POWER PRESCALER FOR A PLL CIRCUIT

[75] Inventor: Morihito Hasegawa, Kasugai, Japan

[73] Assignee: Fujitsu Limited, Kawasaki, Japan

[21] Appl. No.: 09/014,250

[22] Filed: Jan. 27, 1998

[30] Foreign Application Priority Data

Jul. 25, 1997 [JP] Japan .................................. 9-200223

[51] Int. Cl.⁷ ............................ H03K 21/00; H03K 23/00
[52] U.S. Cl. ........................... 331/1 A; 327/159; 327/160; 327/231; 377/47
[58] Field of Search ................................ 377/52, 47, 50, 377/114, 48, 49; 331/1 A; 327/174, 117, 231, 159, 160, 115

[56] References Cited

U.S. PATENT DOCUMENTS 5,640,116  6/1997  Kobayashi et al. ................... 327/231
5,878,101  3/1999  Aisaka ..................................... 377/47
5,892,405  4/1999  Kamikubo et al. ................... 331/1 A

*Primary Examiner*—Arnold Kinkead
*Attorney, Agent, or Firm*—Armstrong Westerman Hattori McLeland & Naughton

[57] ABSTRACT

A prescaler which can be used in a PLL includes a counter section and an extender section. The counter section has a pair of staged, synchronous flip-flops which generate a frequency divided signal by frequency dividing an input oscillation signal by either two or three. The extender section has a plurality of staged, asynchronous flip-flops which generates a second frequency divided signal. A switching circuit connected between the extender section and the counter section controls whether the counter section operates as either a binary counter or a ternary counter. Power conservation is achieved by limiting the counter section to only a pair of flip-flops.

30 Claims, 14 Drawing Sheets

LOW POWER PRESCALER FOR A PLL CIRCUIT

BACKGROUND OF THE INVENTION

The present invention relates to a prescaler for use in a PLL (Phase Locked Loop) circuit, which allows the frequency of an output signal to coincide with a preset frequency.

PLL circuits are commonly used in mobile communication devices such as automobile telephones and portable telephones. The operational frequency of such a PLL circuit is continually increasing. The rise in the operational frequency increases the power dissipation of the PLL circuit. One way to reduce the power dissipation of a PLL circuit is to decrease the power dissipation of a prescaler used in the PLL circuit.

FIG. 1 shows a conventional prescaler 50 used in a PLL circuit. A voltage controlled oscillator (not shown) is provided at a preceding stage of the prescaler 50. A buffer circuit 51 sends a pulse signal $f_{VCO}$ from the oscillator to individual flip-flop circuits FF1 to FF3 as a clock signal CK. An output signal XQ of the flip-flop circuit FF1 is input as data D to the flip-flop circuit FF2. The output signal Q of the flip-flop circuit FF2 is input as data D to the flip-flop circuit FF3. The output signals Q of the flip-flop circuits FF2 and FF3 are both input to an OR gate 52a. The output signal of the OR gate 52a is input as data D to the flip-flop circuit FF1.

The output signal XQ of the flip-flop circuit FF1 is also input as the clock signal CK to a flip-flop circuit FFL2. The output signal XQ of the flip-flop circuit FFL2 is fed back as data D to FFL1. The output signal Q of the flip-flop circuit FFL1 is input as the clock signal CK to a flip-flop circuit FFL2. The output signal XQ of the flip-flop circuit FFL2 is fed back as data D to FFL2. The signal Q from the flip-flop circuit FFL2 is sent out as a frequency-divided signal $P_{out}$.

The signals Q from the flip-flop circuits FFL1 and FFL2 are both input to an OR gate 52b. The OR gate 52b also receives an externally supplied module control signal MD for controlling the operation of the prescaler 50. The output signal of the OR gate 52b is input as a control signal M to the flip-flop circuit FF3. When the control signal M has an L level, the flip-flop circuit FF3 functions normally, whereas when the control signal M has an H level, the flip-flop circuit FF3 fixes the output signal Q to an L level.

The operation of the prescaler 50 will be discussed below with reference to FIG. 2.

While the pulse signal $f_{VCO}$ from the oscillator is input to the prescaler 50, the flip-flop circuits FF1 and FF2 operate so that the output signal XQ, which is the pulse signal $f_{VCO}$ frequency-divided by four, is output from the flip-flop circuit FF1. The output signal Q of the flip-flop circuit FF2 is delayed in phase by a ¼ period of the output signal XQ of the flip-flop circuit FF1 or by one period of the pulse signal $f_{VCO}$.

The output signal Q of the flip-flop circuit FFL1 is set to a signal which is the output signal XQ of the flip-flop circuit FF1 frequency-divided by two or the pulse signal $f_{VCO}$ frequency-divided by 8. The output signal Q of the flip-flop circuit FFL2 is set to a signal which is the pulse signal $f_{VCO}$ frequency-divided by 16.

When the module control signal MD is at an L level, the control signal M of the OR gate 52b is determined based on the output signals Q of the flip-flop circuits FFL1 and FFL2. One of the output signals Q from the flip-flop circuits FFL1 and FFL2 is set to an H level since the prescaler 50 has started counting the pulse signal $f_{VCO}$ and until the prescaler 50 counts twelve pulses of the pulse signal $f_{VCO}$. Having one of the Q outputs of FFL1 and FFL2 high sets the control signal M to the H level. With the control signal M set to the H level, the signal Q from the flip-flop circuit FF3 is fixed to the L level.

When twelve pulses of the pulse signal $f_{VCO}$ are counted, the output signals Q from both flip-flop circuits FFL1 and FFL2 are set to the L levels, which sets the control signal M to the L level. When the control signal M is set to the L level, the flip-flop circuit FF3 is activated. As a result, the FF3 output signal Q, which is delayed from the signal Q from the flip-flop circuit FF2 by one period of the pulse signal $f_{VCO}$, is output from the flip-flop circuit FF3.

Then, the output signal XQ of the flip-flop circuit FF1 rises with a delay of one period of the pulse signal $f_{VCO}$ from the falling of the FF3 output signal Q.

In synchronism with the rising of the output signal XQ of the flip-flop circuit FF1, the output signals Q of the flip-flop circuits FFL1 and FFL2 rise to the H levels and the control signal M rises to the H level simultaneously. Then, the prescaler 50 starts a new counting operation.

When the module control signal MD is at the L level, as discussed above, the signal $P_{out}$ which is the pulse signal $f_{VCO}$ frequency-divided by M+1 (M=16) is output. When the module control signal MD is at the H level, on the other hand, the control signal M from the OR gate 52b is fixed to the H level, which disables the flip-flop circuit FF3 and fixes the output signal Q of the flip-flop circuit FF3 to the L level. When the module control signal MD has the H level, therefore, the signal $P_{out}$ which is the pulse signal $f_{VCO}$ frequency-divided by M (M=16) is output.

As the operational frequency of a PLL circuit is increased, the flip-flop circuits FF1–FF3 in the prescaler 50 are constructed with an ECL (Emitter Coupled Logic) circuit or the like, comprised of bipolar transistors.

As the number of stages of the flip-flop circuits FF1–FF3 connected to the buffer circuit 51 increases, therefore, the number of transistors which are driven by the buffer circuit 51 increases. The increased number of stages of the flip-flop circuits FF1–FF3 increases the line capacitances between the flip-flop circuits FF1–FF3 and the buffer circuit 51. This increased line capacitance increases the load on the buffer circuit 51 and results in increased power dissipation of the prescaler 50.

As the operational frequencies of the flip-flop circuits FF1–FF3 are high, the charge or discharge on the lines between the circuits FF1–FF3 and the buffer circuit 51 are carried out fast. Therefore, the multi-stages of the flip-flop circuits FF1–FF3 likewise raise the problems of increased power dissipation.

Accordingly, it is an object of the present invention to provide a prescaler capable of reducing power dissipation, a frequency divider which uses the prescaler, and a PLL circuit which uses the frequency divider.

SUMMARY OF THE INVENTION

To achieve the above objetive, the present invention provides a prescaler comprising: a buffer circuit for amplifying an input signal and for generating an amplified signal; a frequency-dividing counter connected to the buffer circuit and having two synchronous flip-flop circuits, for generating a first frequency-divided signal by frequency-dividing the amplified signal by one of two and three; a switching circuit, connected to the frequency-dividing counter, for generating, in response to an activated module control signal, a first switching signal used to operate the frequency-dividing counter as a binary counter, and for generating, in response to a deactivated module control signal, a second switching signal used to operate the frequency-dividing counter as a ternary counter; and an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits, wherein the extender generates the second frequency-divided signal divided by 2n when the frequency-dividing counter generates the first frequency divided signal that is divided by two, and wherein the extender generates the second frequency-divided signal frequency-divided by (2n−1) when the frequency-dividing counter generates the first frequency divided signal divided by three.

The present invention further provides a frequency divider comprising: a prescaler which receives an input signal and generates a frequency divided signal therefrom, a main counter for generating a first count signal, obtained by further frequency-dividing the frequency-divided signal from the prescaler by a first frequency-dividing ratio; a swallow counter for generating a second count signal, obtained by further frequency-dividing the frequency-divided signal by a second frequency-dividing ratio different from the first frequency-dividing ratio; and a controller for generating a module control signal in response to the first and second count signals, wherein the prescaler includes: a buffer circuit for amplifying an input signal and for generating an amplified signal; a frequency-dividing counter connected to the buffer circuit and having two synchronous flip-flop circuits, for generating a first frequency-divided signal by frequency-dividing the amplified signal by one of two and three; a switching circuit, connected to the frequency-dividing counter, for generating, in response to the module control signal being active, a first switching signal used to operate the frequency-dividing counter as a binary counter, and for generating, in response to the module control signal being inactive, a second switching signal used to operate the frequency-dividing counter as a ternary counter; and an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits, wherein the extender generates the second frequency-divided signal divided by 2n when the frequency-dividing counter generates the first frequency divided signal that is divided by two, and wherein the extender generates the second frequency-divided signal frequency-divided by (2n−1) when the frequency-dividing counter generates the first frequency divided signal divided by three.

The present invention provides a PLL (Phase Locked Loop) circuit comprising: a reference frequency divider for generating a reference signal by frequency-dividing a reference clock signal; a phase comparator for comparing a phase of the reference signal with a phase of a comparison signal and for generating a signal in response to the reference signal and the comparison signal; a charge pump for converting the signal from the phase comparator into a current signal; a low-pass filter for smoothing the current signal and generating a voltage signal; a voltage controlled oscillator for generating an oscillation signal having a frequency proportional to the voltage signal from the low-pass filter; and a comparative frequency divider for frequency-dividing the oscillation signal from the voltage controlled oscillator and generating a resultant, frequency-divided signal as the comparison signal, the comparative frequency divider comprising: a prescaler which receives the oscillation signal and generates a frequency-divided signal therefrom; a main counter for generating a first count signal, obtained by further frequency-dividing the frequency-divided signal from the prescaler by a first frequency-dividing ratio; a swallow counter for generating a second count signal, obtained by further frequency-dividing the frequency-divided signal by a second frequency-dividing ratio different from the first frequency-dividing ratio; and a controller for generating a module control signal in response to the first and second count signals; and wherein the prescaler includes: a buffer for receiving the oscillation signal and generating an amplified signal; a frequency-dividing counter connected to the buffer circuit and having two synchronous flip-flop circuits, for generating a first frequency-divided signal by frequency-dividing the amplified signal by one of two and three; a switching circuit, connected to the frequency-dividing counter, for generating, in response to the module control signal being active, a first switching signal used to operate the frequency-dividing counter as a binary counter, and for generating, in response to the module control signal being inactive, a second switching signal used to operate the frequency-dividing counter as a ternary counter; and an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits, wherein the extender generates the second frequency-divided signal divided by 2n when the frequency-dividing counter generates the first frequency divided signal that is divided by two, and wherein the extender generates the second frequency-divided signal frequency-divided by (2n−1) when the frequency-dividing counter generates the first frequency divided signal divided by three.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

An outline of the present invention will now be described referring to FIG. 3.

Figure 3:
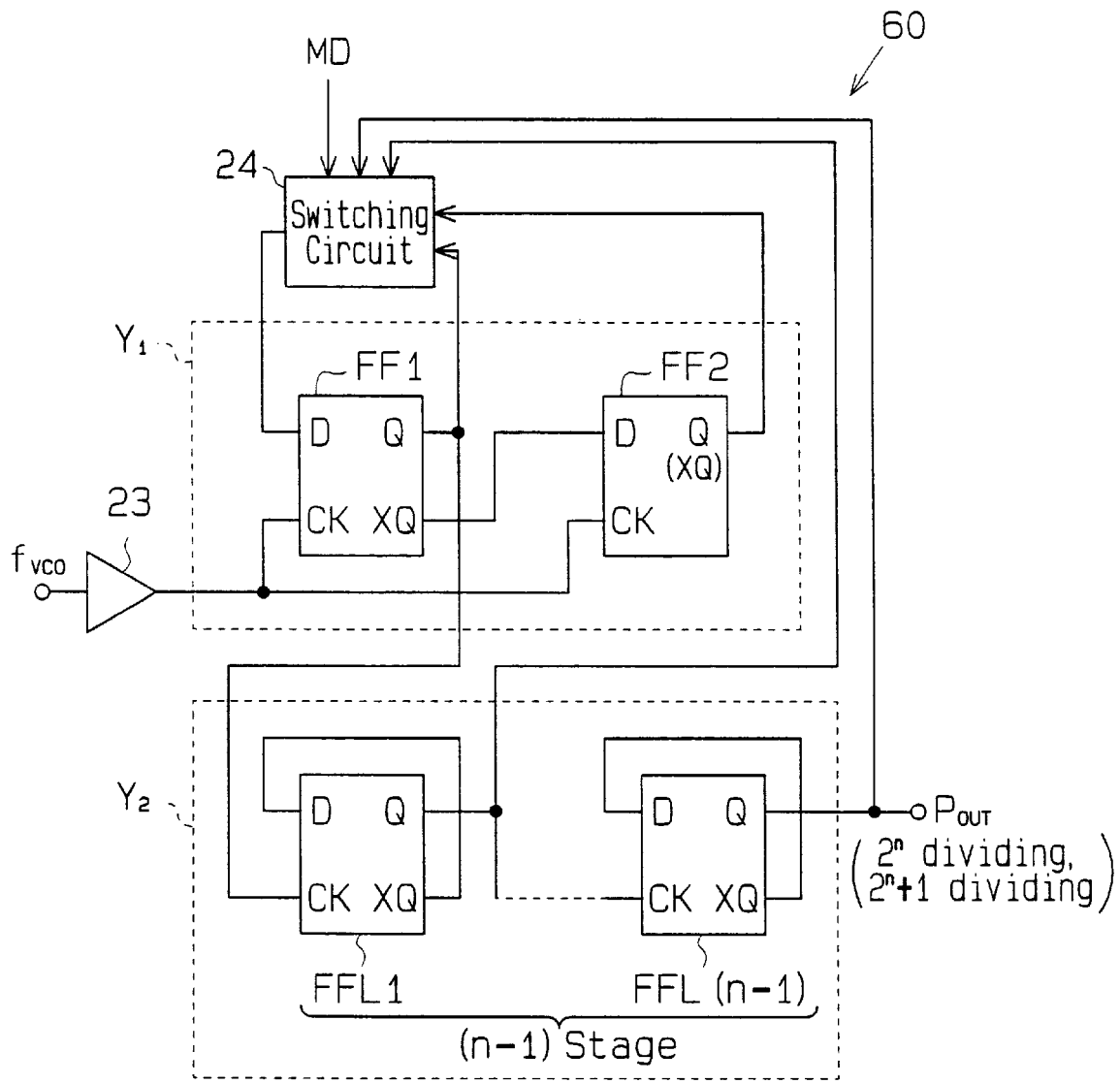
FIG. 3 is a schematic block diagram of the present invention.

In a prescaler 60 embodying the present invention, as shown in FIG. 3, a pulse signal $f_{VCO}$ is input via a buffer circuit 23 to a pair of staged, synchronous flip-flop circuits FF1 and FF2 which constitute a counter section $Y_1$. The number of transistors driven by the buffer circuit 23 is less than that of the conventional prescaler. This reduces the power dissipation of the buffer circuit 23. According to the present invention, a series of staged flip-flop circuits FFL1 to FF(n−1), comprise an extender section $Y_2$. Comprised to the prior art prescaler 50, the number of flip-flops in the extender section $Y_2$ is increased by the reduced number of stages of the flip-flop circuits FF1 and FF2 of the counter section $Y_1$. However, the operational frequency of the flip-flop circuits of the extender section $Y_2$ is one half of the operational frequency of the flip-flop circuits FF1 and FF2 of the counter section $Y_1$. The reduction in operational frequency decreases the power dissipation of the prescaler. The prescaler 60 further comprises a switching circuit 24 connected between the counter section $Y_1$ and the extender section $Y_2$. The switching circuit 24 uses a current source common to the flip-flop circuits FF1 and FF2 of the counter section $Y_1$. Accordingly, it is unnecessary to provide a separate current source for the switching circuit 24, which contributes to reducing the number of current sources of the prescaler 60 as well as reducing the power dissipation thereof.

First Embodiment

A first preferred embodiment of the present invention will now be described with reference to FIGS. 4 through 9.

Figure 4:
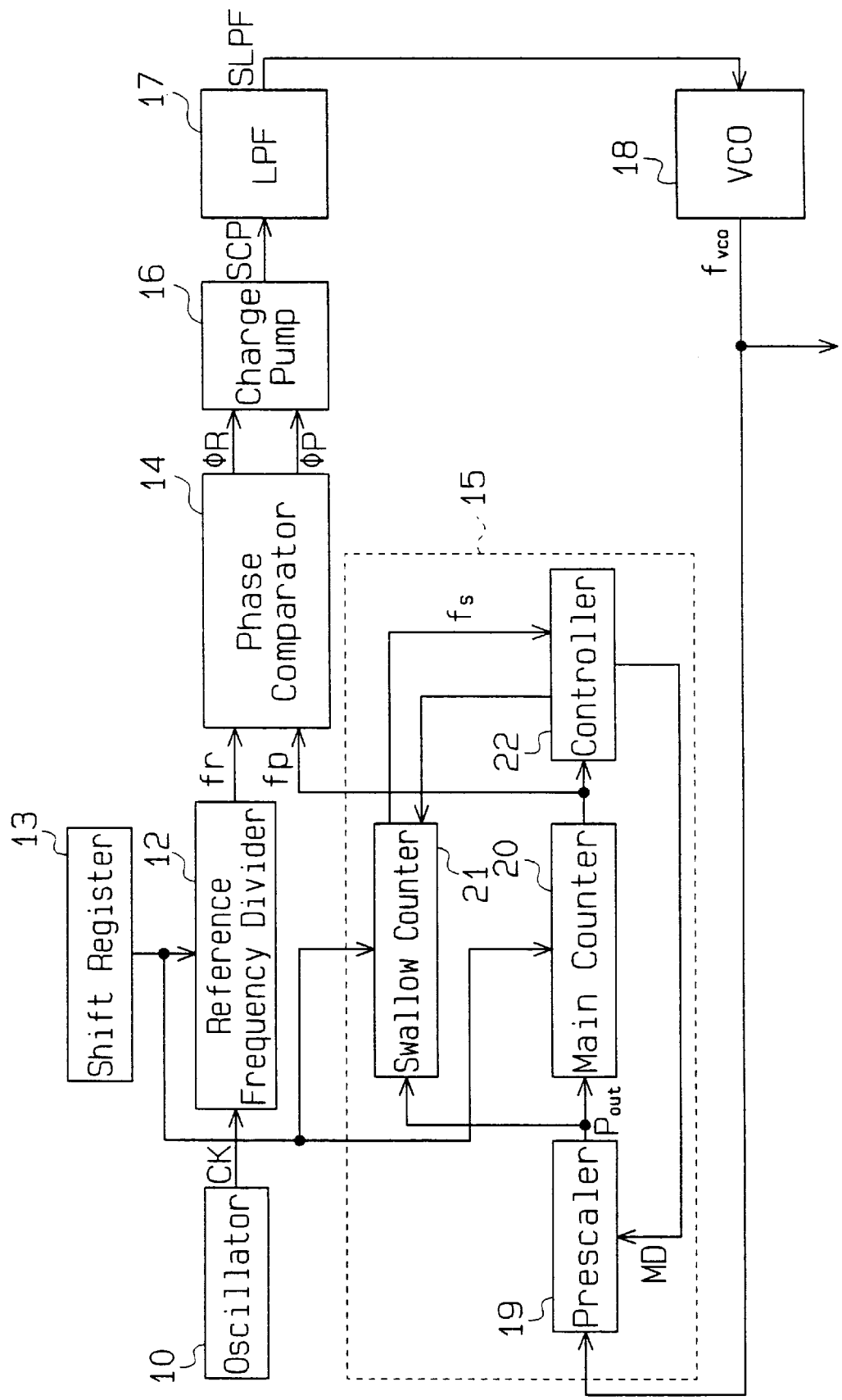
FIG. 4 is a schematic block diagram of a PLL circuit incorporating a prescaler of the present invention.

As shown in FIG. 4, an oscillator 10 sends a specific frequency based on the oscillation of a quartz oscillator to a reference frequency divider 12 as a reference clock signal CK. The reference frequency divider 12, which is constituted by a counter circuit, frequency-divides the reference clock signal CK based on the frequency-dividing ratio preset in a shift register 13, and sends a reference signal fr to a phase comparator 14. The phase comparator 14 receives a comparison signal fp from a comparative frequency divider 15, and sends pulse signals φR and φP according to the frequency difference and phase difference between the reference signal fr and the comparison signal fp to a charge pump 16.

The charge pump 16 sends an output signal SCP to a low-pass filter (hereinafter referred to as "LPF") 17 based on the pulse signals φR and φP from the phase comparator 14. The output signal SCP includes a DC component and a pulse component. The DC component of the signal SCP corresponds to the frequency difference between the pulse signals φR and φP, and the pulse component varies based on the phase difference between the pulse signals φR and φP.

The LPF 17 sends an output signal SLPF having its high-frequency component removed to a voltage controlled oscillator (hereinafter referred to as "VCO") 18 to smooth the output signal SCP of the charge pump 16. The VCO 18 sends a pulse signal $f_{VCO}$, whose frequency corresponds to the voltage value of the signal SLPF from the LPF 17, to an external circuit (not shown) and the comparative frequency divider 15.

The comparative frequency divider 15, which is of a pulse swallow type, includes a prescaler 19, a main counter 20, a swallow counter 21 and a controller 22.

The pulse signal $f_{VCO}$ from the VCO 18 is input to the prescaler 19 of the comparative frequency divider 15. The prescaler 19 divides the frequency of the pulse signal $f_{VCO}$ by a value M or M+1, and sends a resultant, frequency-divided signal $P_{out}$ to the main counter 20 and the swallow counter 21.

The main counter 20 frequency-divides the frequency-divided signal $P_{out}$ from the prescaler 19 by 'N' based on a frequency-dividing ratio set in the shift register 13, and sends a resultant, frequency-divided signal as a comparison signal fp to the phase comparator 14. The frequency-divided signal from the main counter 20 is also input to the controller 22. Every time the main counter frequency-divides the frequency-divided signal $P_{out}$ by N, the controller 22 sends an enable signal to the swallow counter 21.

The swallow counter 21 further frequency-divides the frequency-divided signal $P_{out}$ from the prescaler 19, and sends a resultant, frequency-divided signal fs to the controller 22. Based on the frequency-divided signal fs from the swallow counter 21, the controller 22 sends a module control signal MD of, for example, an H level to the prescaler 19. Based on the H-level module control signal MD, the prescaler 19 outputs the signal $P_{out}$ which is the pulse signal $f_{VCO}$ frequency-divided by M.

On the other hand, the controller 22 outputs the module control signal MD of, for example, an L level until the swallow counter 21 counts 'A' pulses. Based on the L-level module control signal MD, the prescaler 19 outputs the signal $P_{out}$ which is the pulse signal $f_{VCO}$ frequency-divided by M+1.

In the above-described PLL circuit, therefore, every time the main counter frequency-divides the frequency-divided signal $P_{out}$ by N, the swallow counter 21 counts the frequency-divided signal $P_{out}$ from the prescaler 19.

Figure 5:
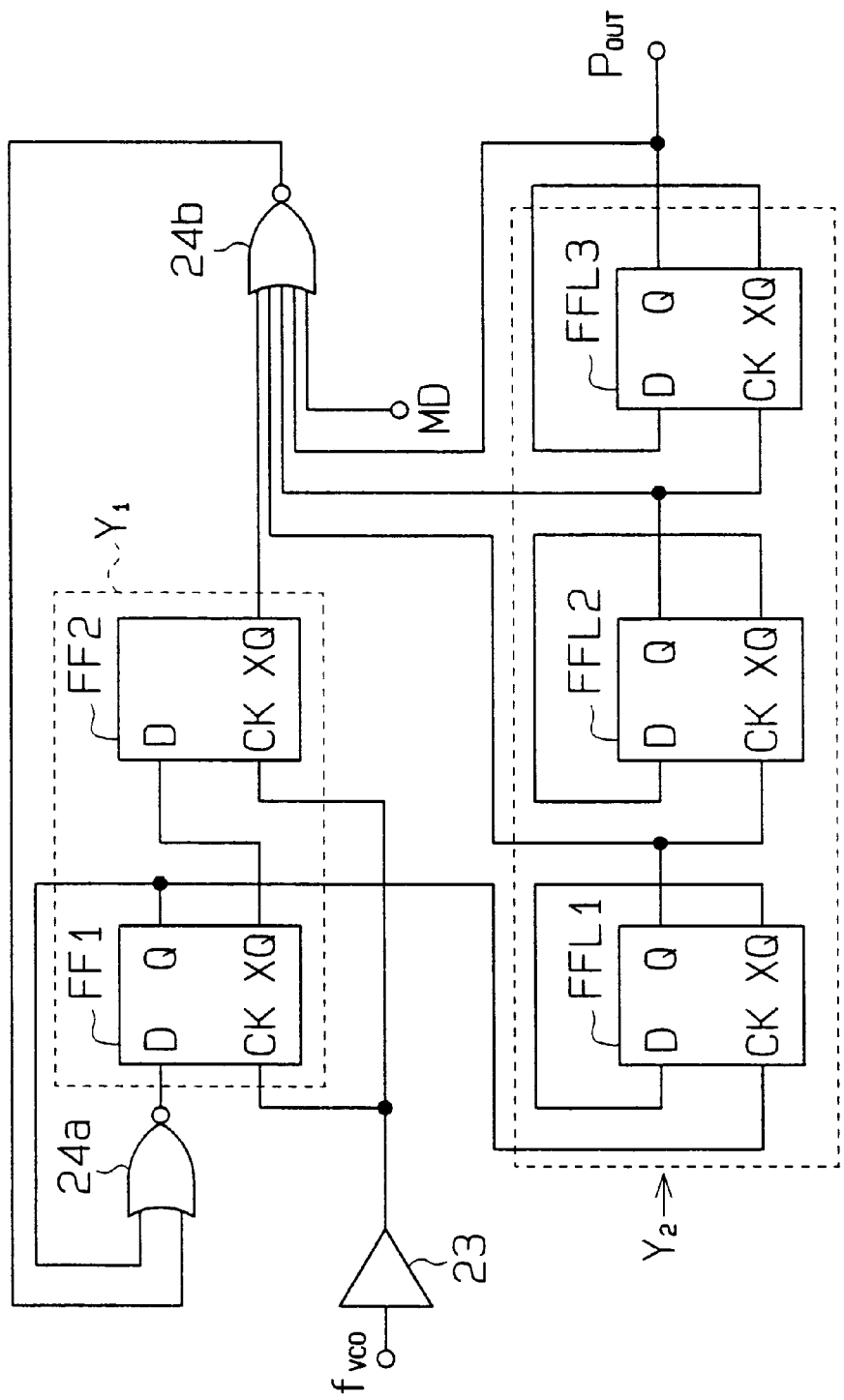
FIG. 5 is a circuit diagram showing a prescaler according to a first embodiment.

The specific structure of the prescaler 19 will now be discussed referring to FIG. 5.

The prescaler 19 includes individual flip-flop circuits FF1 and FF2, which receive the pulse signal $f_{VCO}$ from the VCO 18, via a buffer circuit 23, as a clock signal CK. The flip-flop circuits FF1 and FF2 constitute a counter section $Y_1$.

A first NOR gate 24a receives a signal Q from the flip-flop circuit FF1 and a signal from a second NOR gate 24b, and provides the flip-flop circuit FF1 with its data D input. A flip-flop circuit FF1 sends its output signal Q as the clock signal CK to the flip-flop circuit FFL1. The flip-flop circuit FFL1 feeds its output signal XQ back to its data D input.

A flip-flop circuit FFL2 receives the signal Q from the flip-flop circuit FFL1 at its clock input as the clock signal CK, and feeds its output signal XQ back to its data D input.

A flip-flop circuit FFL3 receives the signal Q from the flip-flop circuit FFL2 at its clock input, as the clock signal CK, and feeds its output signal XQ back to its data D input. The flip-flop circuit FFL3 outputs an output signal Q as the frequency-divided signal $P_{out}$. The flip-flop circuits FFL1–FFL3 constitute an extender section $Y_2$.

The flip-flop circuit FF2 receives the signal XQ from the flip-flop circuit FF1 at its data D input. The NOR gate 24b receives the signal XQ from the flip-flop circuit FF2 and the output signals Q from the flip-flop circuits FFL1–FFL3. The NOR gate 24b also receives the module control signal MD from the controller 22. The NOR gates 24b and 24a constitute a switching circuit.

Figure 6:
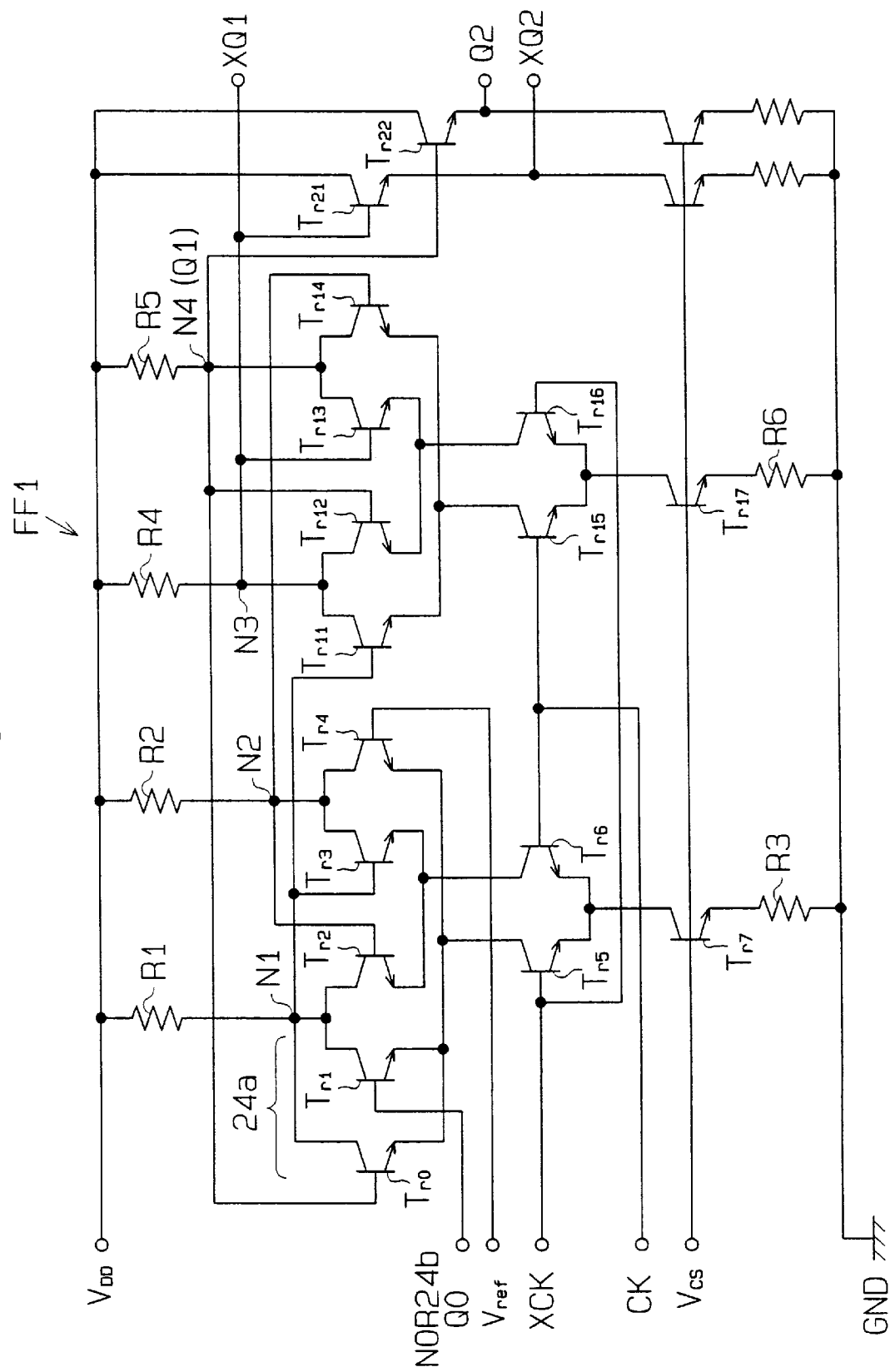
FIG. 6 is a circuit diagram specifically showing a flip-flop circuit FF1 and a NOR gate.

As shown in FIG. 6, the flip-flop circuit FF1 and the first NOR gate 24a comprise a plurality of npn-type bipolar transistors (hereinafter simply referred to as "transistors") and resistors.

Transistors $T_{r1}$ and $T_{r2}$ have collectors (node N1) connected to a supply voltage $V_{DD}$ via a resistor R1. Transistors $T_{r3}$ and $T_{r4}$ have collectors (node N2) connected to the supply voltage $V_{DD}$ via a resistor R2.

The transistor $T_{r1}$ has a base which receives a signal from the NOR gate 24b (output signal Q0 shown in FIG. 7 which will be discussed later). The transistor $T_{r4}$ has a base which receives a reference voltage signal $V_{ref}$. The reference voltage signal $V_{ref}$ is a constant voltage signal of an intermediate level between the levels of the signals Q from the flip-flop circuits FF1 and FF2 (output signals Q1 in this case). The transistor $T_{r2}$ has a base connected to the node N2. The transistor $T_{r3}$ has a base connected to the node N1.

Transistors $T_{r5}$ and $T_{r6}$ have bases which receive the clock signals CK (complementary clock signals XCK and CK in this case). Based on the input clock signal CK, the transistor $T_{r5}$ alternately enables the transistors $T_{r1}$ and $T_{r4}$. Based on the input clock signal XCK, the transistor $T_{r6}$ alternately enables the transistors $T_{r2}$ and $T_{r3}$. The transistors $T_{r5}$ and $T_{r6}$ are connected to ground GND via a transistor $T_{r7}$ and a resistor R3. The transistor $T_{r7}$ has a base which receives a chip select signal $V_{CS}$. The transistor $T_{r7}$ enables the transistors $T_{r5}$ and $T_{r6}$ based on the input chip select signal $V_{CS}$.

Transistors $T_{r11}$ and $T_{r12}$ have collectors (node N3) connected to the supply voltage $V_{DD}$ via a resistor R4. Transistors $T_{r13}$ and $T_{r14}$ have collectors (node N4) connected to the supply voltage $V_{DD}$ via a resistor R5. The flip-flop circuit FF1 outputs the output signal XQ (XQ1) from the node N3, and the output signal Q (Q1) from the node N4. The flip-flop circuit FF2 receives the signal XQ1 as its data D input.

The transistor $T_{r11}$ has a base connected to the node N1, while the transistor $T_{r14}$ has a base connected to the node N2. The transistor $T_{r12}$ has a base connected to the node N4, while the transistor $T_{r13}$ has a base connected to the node N3.

Transistors $T_{r15}$ and $T_{r16}$ have bases which receive the clock signals CK and the complementary clock signal XCK, respectively. Based on the input clock signal CK, the transistor $T_{r15}$ alternately enables the transistors $T_{r11}$ and $T_{r14}$. Based on the input clock signal XCK, the transistor $T_{r16}$ alternately enables the transistors $T_{r12}$ and $T_{r13}$. The transistors $T_{r15}$ and $T_{r16}$ are connected to ground GND via a transistor $T_{r17}$ and a resistor R6. The transistor $T_{r17}$ enables the transistors $T_{r15}$ and $T_{r16}$ based on the chip select signal $V_{CS}$ input to its base.

The transistor $T_{r1}$ and a transistor Tr0 form the NOR gate 24a which is preferably an ECL (Emitter Coupled Logic) circuit. The transistor Tr0 has a base which receives the signal Q(Q1). The first NOR gate 24a outputs a signal from the node N1.

A transistor $T_{r21}$ constitutes an emitter follower. The transistor $T_{r21}$ receives the signal XQ1 from the node N3 at its base and sends an amplified signal XQ2 out of the flip-flop circuit FF1. Likewise, a transistor $T_{r22}$ constitutes an emitter follower. The transistor $T_{r22}$ receives the signal Q1 from the node N4 at its base and sends an amplified signal Q2 out of the flip-flop circuit FF1. The flip-flop circuit FFL1 receives the signals Q2 and XQ2 as the clock signals CK (complementary clock signals CK and XCK).

Figure 9:
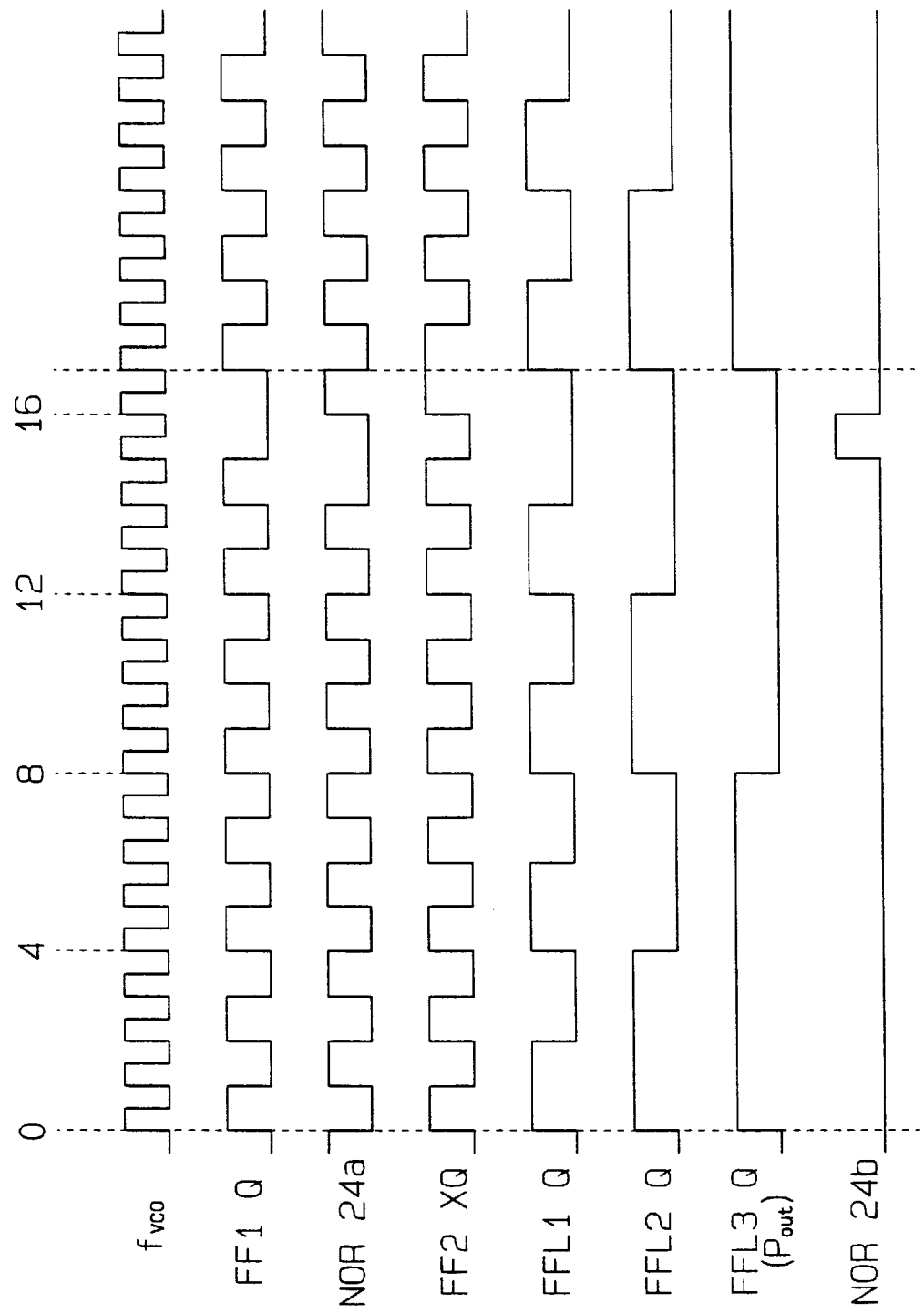
FIG. 9 is a timing chart illustrating the operation of the prescaler of FIG. 5.

When the clock signal CK goes high (H level) from low (L level), the first NOR gate 24a outputs its output signal (the potential at the node N1) as the output signal Q (Q1, Q2) of the flip-flop circuit FF1 from the node N4. The inverted signal of the signal from the first NOR gate 24a is sent out from the node N3 as the output signal XQ (XQ1, XQ2). In this manner, the flip-flop circuit FF1 outputs the signal Q (Q1, Q2) and the first NOR gate 24a outputs a signal as shown in FIG. 9.

Figure 7:
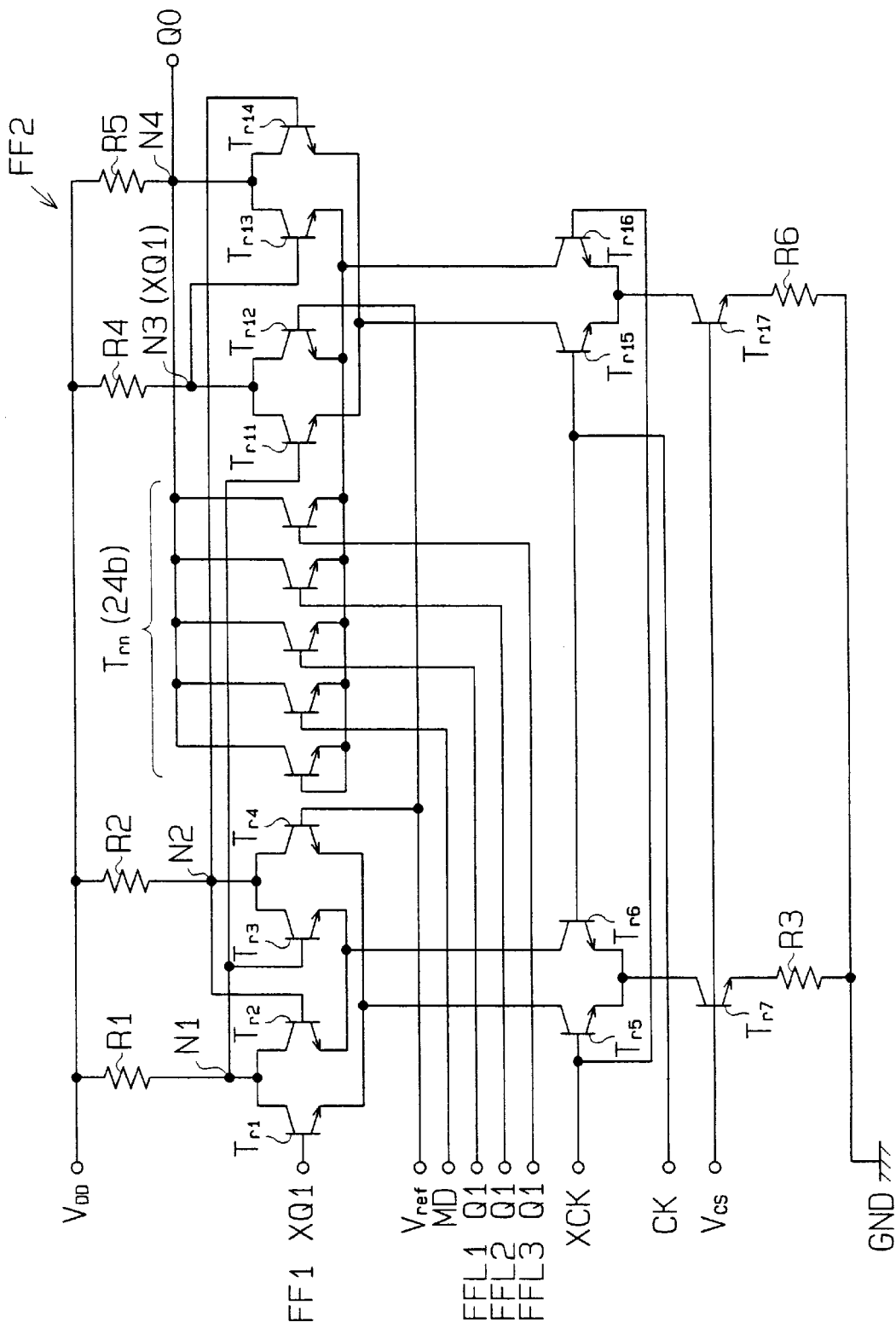
FIG. 7 is a detailed circuit diagram specifically showing a flip-flop circuit FF2 and a NOR gate of the prescaler of FIG. 5.

As shown in FIG. 7, the flip-flop circuit FF2 and the second NOR gate 24b likewise comprise a plurality of npn transistors and resistors.

The following will discuss the differences between the flip-flop circuit FF2 and the flip-flop circuit FF1. The flip-flop circuit FF2 has no transistor Tr0. The transistor $T_{r1}$ has a base which receives the signal XQ (XQ1) from the flip-flop circuit FF1. The transistor $T_{r12}$ has a base which receives the reference voltage signal $V_{ref}$.

The second NOR gate 24b comprises a plurality of transistors Trn which constitute an ECL circuit. The second NOR gate 24b is connected to the node N4. One of the transistors Trn receives the module control signal MD at its base and three of the transistors Trn respectively receive the output signals Q of the flip-flop circuits FFL1–FFL3 (output signals Q1 shown in FIG. 8 which will be discussed later) at their bases. The second NOR gate 24b sends its output signal Q0 from the node N4. The output signal Q0 is input to the base of the transistor $T_{r1}$ of the first NOR gate 24a shown in FIG. 6.

In the flip-flop circuit FF2 and NOR gate 24b, when any one of the signals XQ(XQ1) from the flip-flop circuit FF2 and the signals Q(Q1) from the flip-flop circuits FFL1–FFL3 is at an H level, the second NOR gate 24b outputs an L-level signal (Q0). When all of the signal XQ (XQ1) from the flip-flop circuit FF2 and the signals Q (Q1) from the flip-flop circuits FFL1–FFL3 have L levels, on the other hand, the second NOR gate 24b outputs an H-level signal (Q0). In this manner, the flip-flop circuit FF2 and the second NOR gate 24b respectively output the signal (Q0) and the signal XQ, as shown in FIG. 9.

Figure 8:
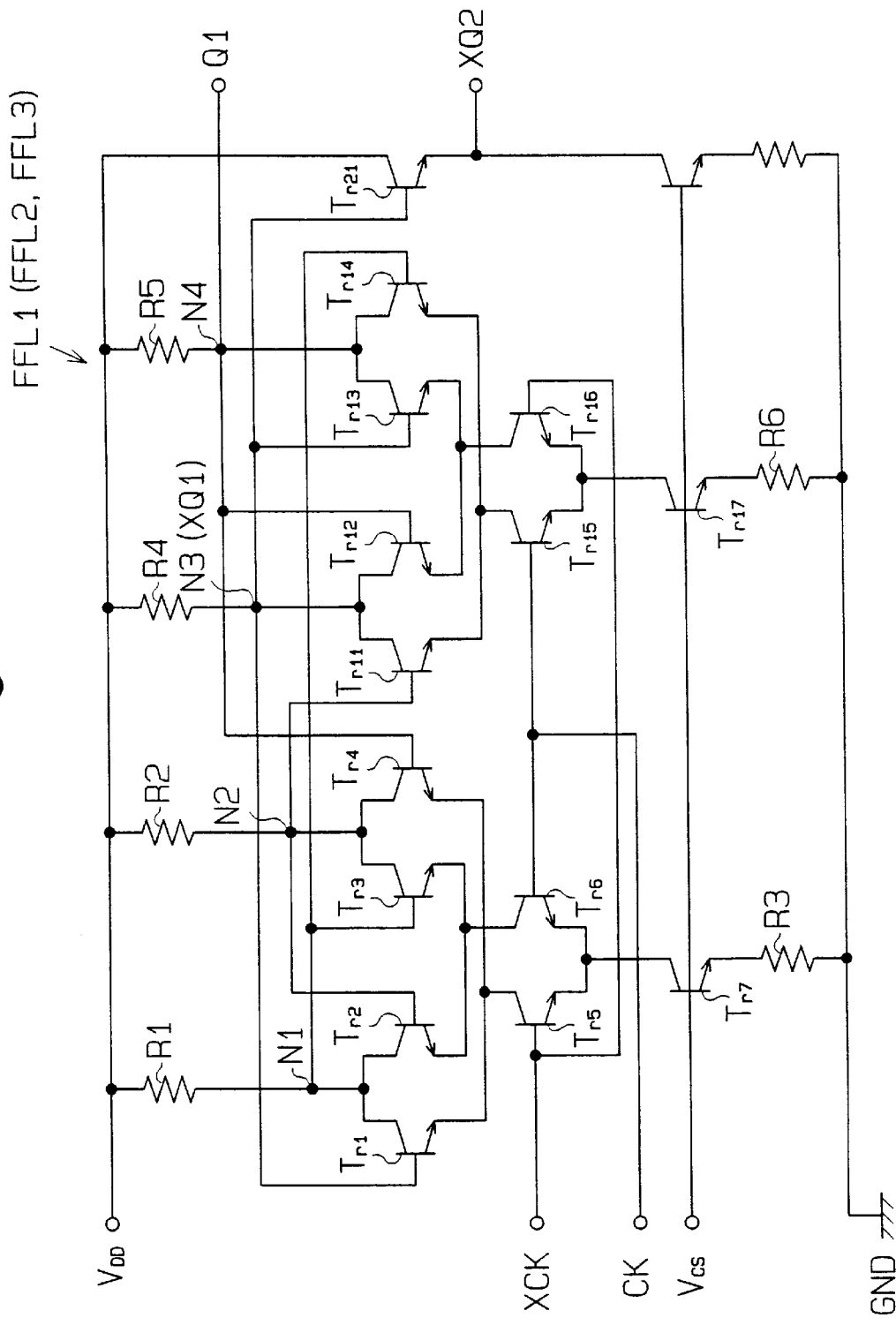
FIG. 8 is a detailed circuit diagram of flip-flop circuits FFL1 to FFL3 of the prescaler of FIG. 5.

As shown in FIG. 8, the flip-flop circuit FFL1 comprises a plurality of transistors and resistors. The flip-flop circuits FFL2 and FFL3 have the same structure as the flip-flop circuit FFL1 accordingly detailed descriptions thereof are not for understanding the present invention.

The following will discuss the structure of the flip-flop circuit FFL1, mainly centered on the differences between the flip-flop circuit FFL1 and the flip-flop circuit FF1. The flip-flop circuit FFL1 does not use the transistor Tr0 of the flip-flop circuit FF1. The transistor $T_{r1}$ has a base connected to the node N3. That is, the output signal XQ (XQ1) of the flip-flop circuit FFL1 is input to the transistor $T_{r1}$. The transistor $T_{r11}$ has a base connected to the node N2, and the transistor $T_{r14}$ has a base connected to the node N1.

The transistor $T_{r21}$ constitutes an emitter follower. The transistor $T_{r21}$ receives the signal XQ1 from the node N3 and sends an amplified signal XQ2 out of the flip-flop circuit FFL1. The flip-flop circuit FFL1 receives the signals Q2 and XQ2 from the flip-flop circuit FF1 as the clock signals CK and XCK. The flip-flop circuit FFL2 receives the signals XQ2 from the flip-flop circuit FFL1 as the complementary clock signal XCK, and receives the externally supplied reference voltage signal as the clock signal CK. The flip-flop circuit FFL3 receives the signals XQ2 from the flip-flop circuit FFL2 as the complementary clock signal XCK, and receives the externally supplied reference voltage signal as the clock signal CK.

In the flip-flop circuit FFL1, a signal obtained by frequency-dividing the clock signal CK by two is output from the node N4 as the output signal Q (Q1) of the flip-flop circuit FFL1, and the signal which is also the clock signal CK frequency-divided by two is output since the output signal XQ2. That is, as the clock signal CK input to the flip-flop circuit FFL1 is the output signal Q of the flip-flop circuit FF1 (the output signal Q2 or XQ2 in this case), a signal which is the output signal Q of the flip-flop circuit FF1 frequency-divided by two is acquired.

In the flip-flop circuit FFL3, a signal which is the clock signal CK frequency-divided by two is output from the node N4 as the output signal Q (Q1). In other words, as the clock signal CK input to the flip-flop circuit FFL2 is the output signal Q of the flip-flop circuit FFL1 (the output signal XQ2 in this case), a signal which is the output signal Q of the flip-flop circuit FFL1 frequency-divided by two is acquired.

In the flip-flop circuit FFL3, a signal which is the clock signal CK frequency-divided by two is output from the node N4 as the output signal Q (Q1), and the signal which is also the clock signal CK frequency-divided by two is output as the output signal XQ2. In other words, as the clock signal CK input to the flip-flop circuit FFL3 is the output signal Q of the flip-flop circuit FFL2 (the output signal XQ2 in this case), a signal which is the output signal Q of the flip-flop circuit FFL2 frequency-divided by two is acquired. In this manner, the output signals Q of the flip-flop circuits FFL1–FFL3, as shown in FIG. 9 are obtained.

The operation of the prescaler 19 according to the first embodiment will be described below with reference to FIG. 9.

When the pulse signal $f_{VCO}$ from the VCO 18 is input to the prescaler 19, the flip-flop circuit FF1 outputs the signal Q which is the pulse signal $f_{VCO}$ frequency-divided by two. The flip-flop circuit FFL1 outputs the signal Q which is the signal Q from the flip-flop circuit FF1 frequency-divided by two, (i.e., the pulse signal $f_{VCO}$ frequency-divided by four). The flip-flop circuit FFL2 outputs the signal Q which is the signal Q from the flip-flop circuit FFL1 frequency-divided by two, (i.e., the pulse signal $f_{VCO}$ frequency-divided by eight). The flip-flop circuit FFL3 outputs the signal Q which is the signal Q from the flip-flop circuit FFL2 frequency-divided by two, (i.e., the pulse signal $f_{VCO}$ frequency-divided by sixteen). The flip-flop circuit FF2 outputs an signal XQ which is the inverted signal of the signal Q from the flip-flop circuit FF1 delayed by one period of the pulse signal $f_{VCO}$.

When the module control signal MD is at the L level, the output signal of the second NOR gate 24b is determined by the output signal XQ of the flip-flop circuit FF2 and the output signals Q of the flip-flop circuits FFL1–FFL3. In other words, any one of the output signal XQ of the flip-flop circuit FF2 and the output signals Q of the flip-flop circuits FFL1–FFL3 is set to the H level since the prescaler 19 has started counting the pulse signal $f_{VCO}$ and until the prescaler 19 counts fifteen pulses of the pulse signal $f_{VCO}$. This fixes the output signal of the second NOR gate 24b to the L level.

When the prescaler 19 counts fifteen pulses of the pulse signal $f_{VCO}$, the output signal XQ of the flip-flop circuit FF1 and the output signals Q of the flip-flop circuits FFL1–FFL3 are all set to the L level. This sets the output signal of the second NOR gate 24b to the H level. When the output signal of the second NOR gate 24b is set to the H level, the first NOR gate 24a outputs an L-level signal. Then, the output signal Q of the flip-flop circuit FF1 rises with a delay of one period of the pulse signal $f_{VCO}$ from the rising of the output signal of the first NOR gate 24a (i.e., the rising of the output signal XQ of the flip-flop circuit FF2).

In response to the rising of the output signal Q of the flip-flop circuit FF1, the output signals Q of the flip-flop circuits FFL1–FFL3 go high, and a new counting operation is initiated.

Through the above operation, when the module control signal MD is at the L level, the prescaler 19 outputs the frequency-divided signal $P_{out}$ which is equal to the pulse signal $f_{VCO}$ divided by M+1 (M=16).

With the module control signal MD being at the H level, the output signal of the second NOR gate 24b is fixed at the L level, disabling the operation of the flip-flop circuit FF2. Then, the flip-flop circuit FF1 functions the normally and outputs the signal Q which is the pulse signal $f_{VCO}$ frequency-divided by two. When the module control signal MD is at the H level, therefore, the prescaler 19 outputs the frequency-divided signal $P_{out}$ which is equal to the pulse signal $f_{VCO}$ divided by M (M=16).

The prescaler 19 with the above structure has the following advantages.

Figure 1:
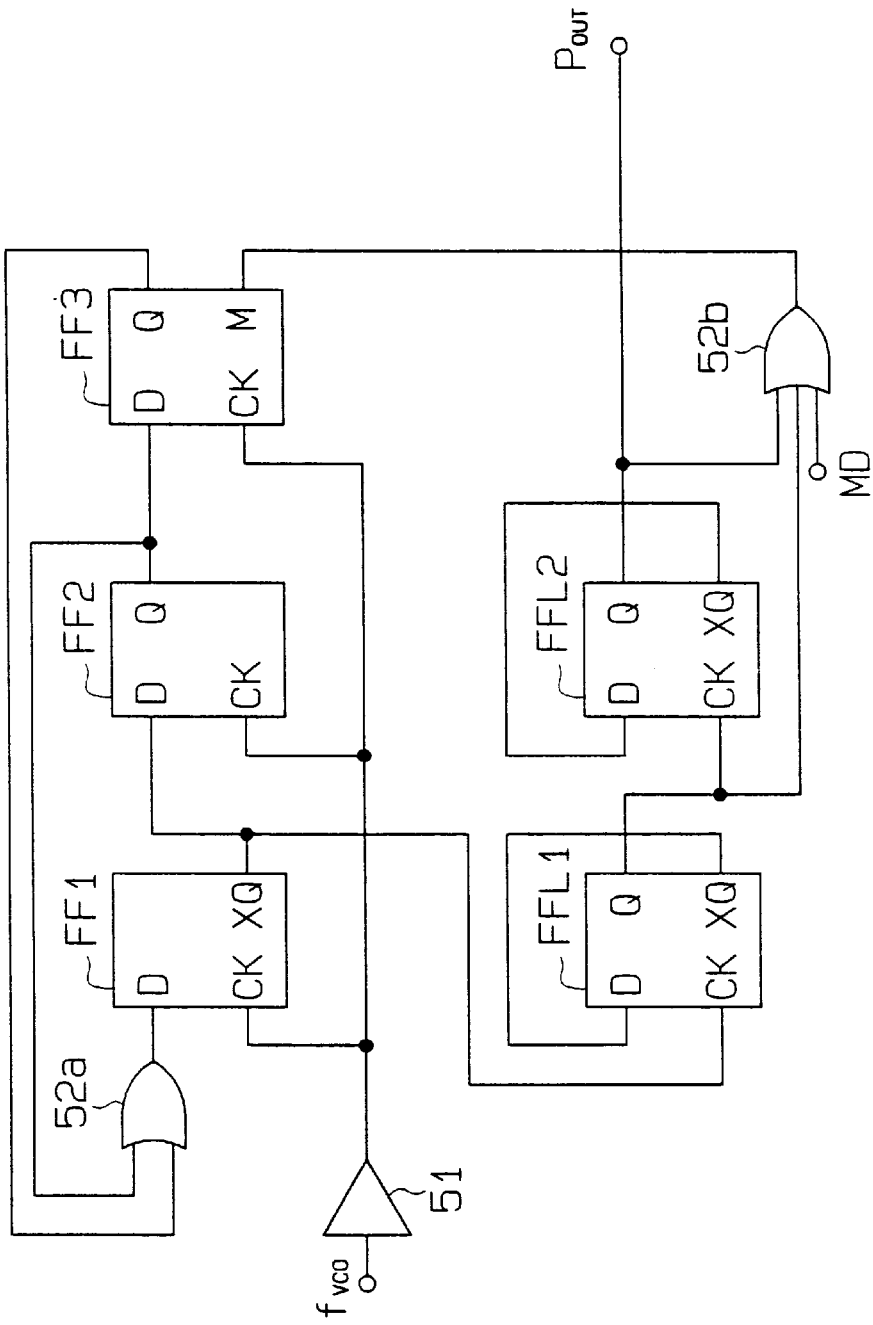
FIG. 1 is a circuit diagram showing a conventional prescaler.
Figure 2:
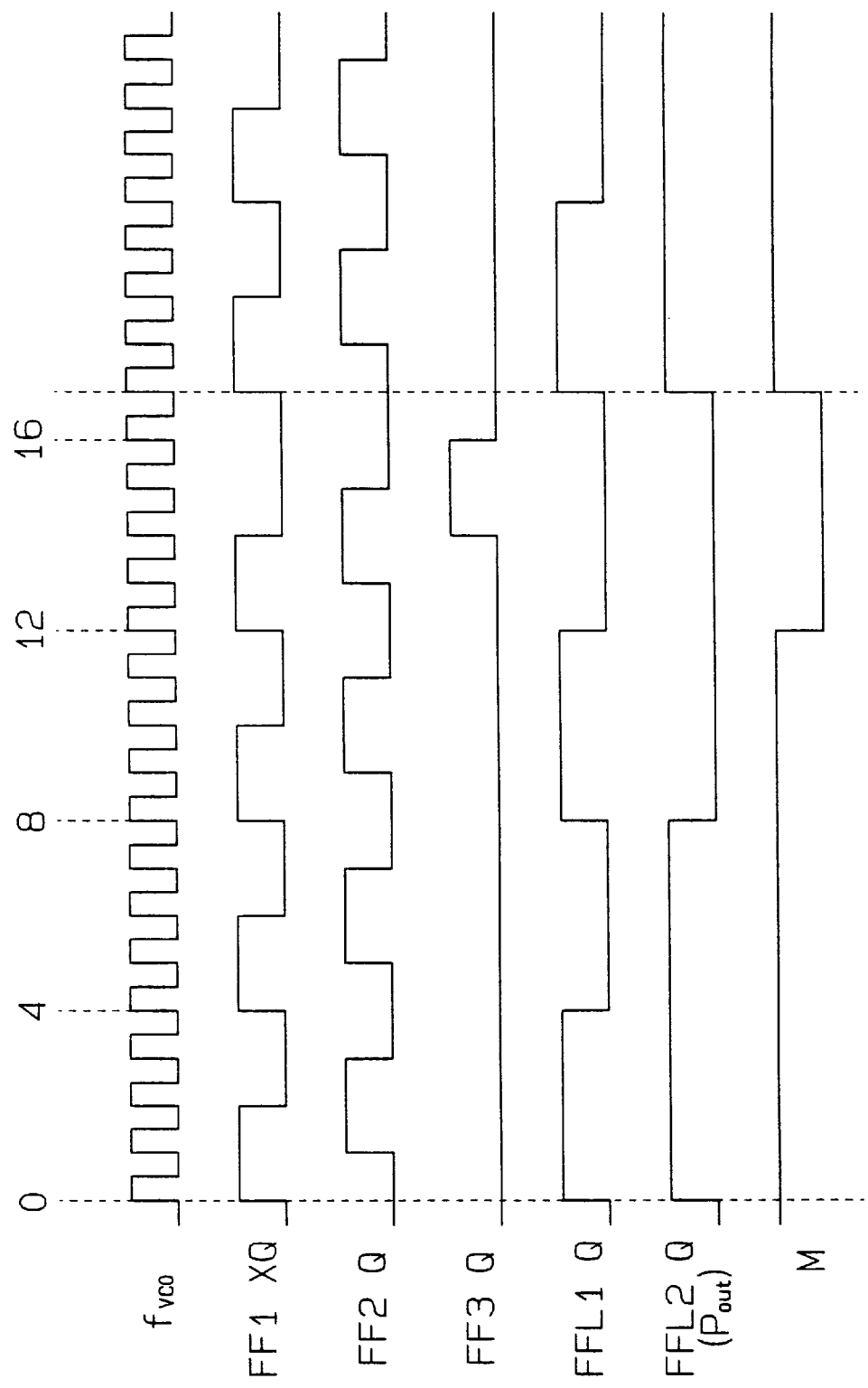
FIG. 2 is a timing chart illustrating the operation of the prescaler of FIG. 1.

(1) The pulse signal $f_{VCO}$ input via the buffer circuit 23 is input as the clock signal CK to the two-staged flip-flop circuits FF1 and FF2, comprised of bipolar transistors. That is, the buffer circuit 23 drives the transistors $T_{r5}$, $T_{r6}$, $T_{r15}$ and $T_{r16}$. Thus, the number of transistors driven by the buffer circuit 23 is less than that in the prior art shown in FIG. 1 which has three-staged flip-flop circuits FF1–FF3. The reduced number of transistors reduce the power dissipation of the prescaler 19, and decreases the circuit area of the prescaler 19.

While the extender section $Y_2$ comprises the flip-flop circuits FFL1–FFL3, which are greater in number by one stage than those of the prior art, the counter section $Y_1$ comprises the flip-flop circuits FF1 and FF2 which are smaller in number by one stage than those of the prior art. Therefore, the operational frequency of the flip-flop circuits of the extender section $Y_2$ is reduced to a half of the operational frequency of the flip-flop circuits of the counter section $Y_1$. This reduction in operational frequency also decreases the power dissipation of the prescaler 19.

Such reduced power dissipation of the prescaler 19 contributes to reducing the power dissipation of the comparative frequency divider 15 equipped with the prescaler 19, and thus to reducing the power dissipation of the PLL circuit equipped with the comparative frequency divider 15.

(2) The first NOR gate 24a operates using the same current source (supply voltage $V_{DD}$) which operates the flip-flop circuit FF1. The second NOR gate 24b operates using the same current source (supply voltage $V_{DD}$) as the flip-flop circuit FF2. Therefore, the first and second NOR gates 24a and 24b share the current sources (the supply voltage $V_{DD}$) of the flip-flop circuits FF1 and FF2 and so not require a special current source of their own. This design reduces the number of current sources in use, which contributes to lessening the power dissipation of the prescaler 19.

Second Embodiment

Figure 10:
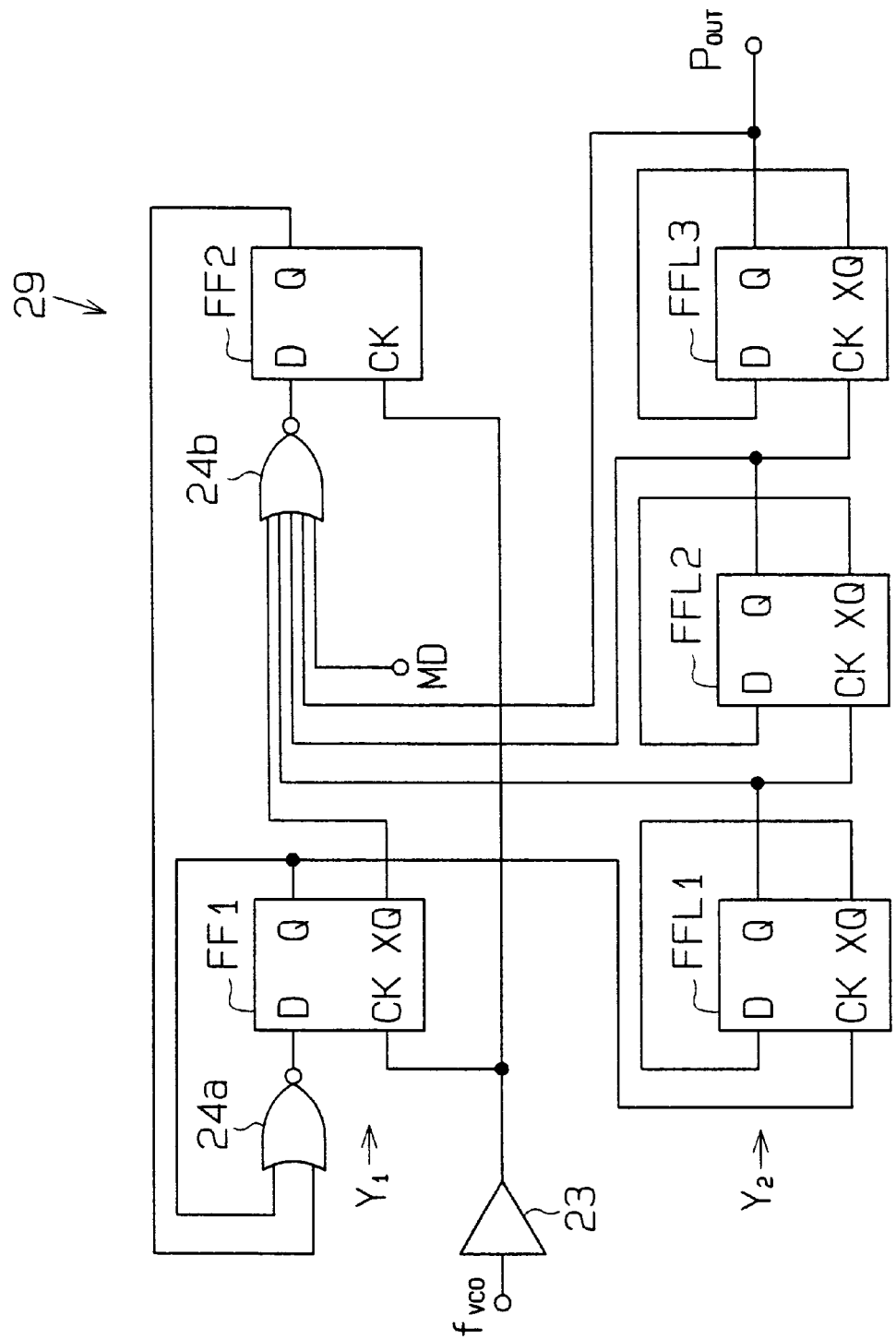
FIG. 10 is a circuit diagram depicting a prescaler according to a second embodiment.
Figure 11:
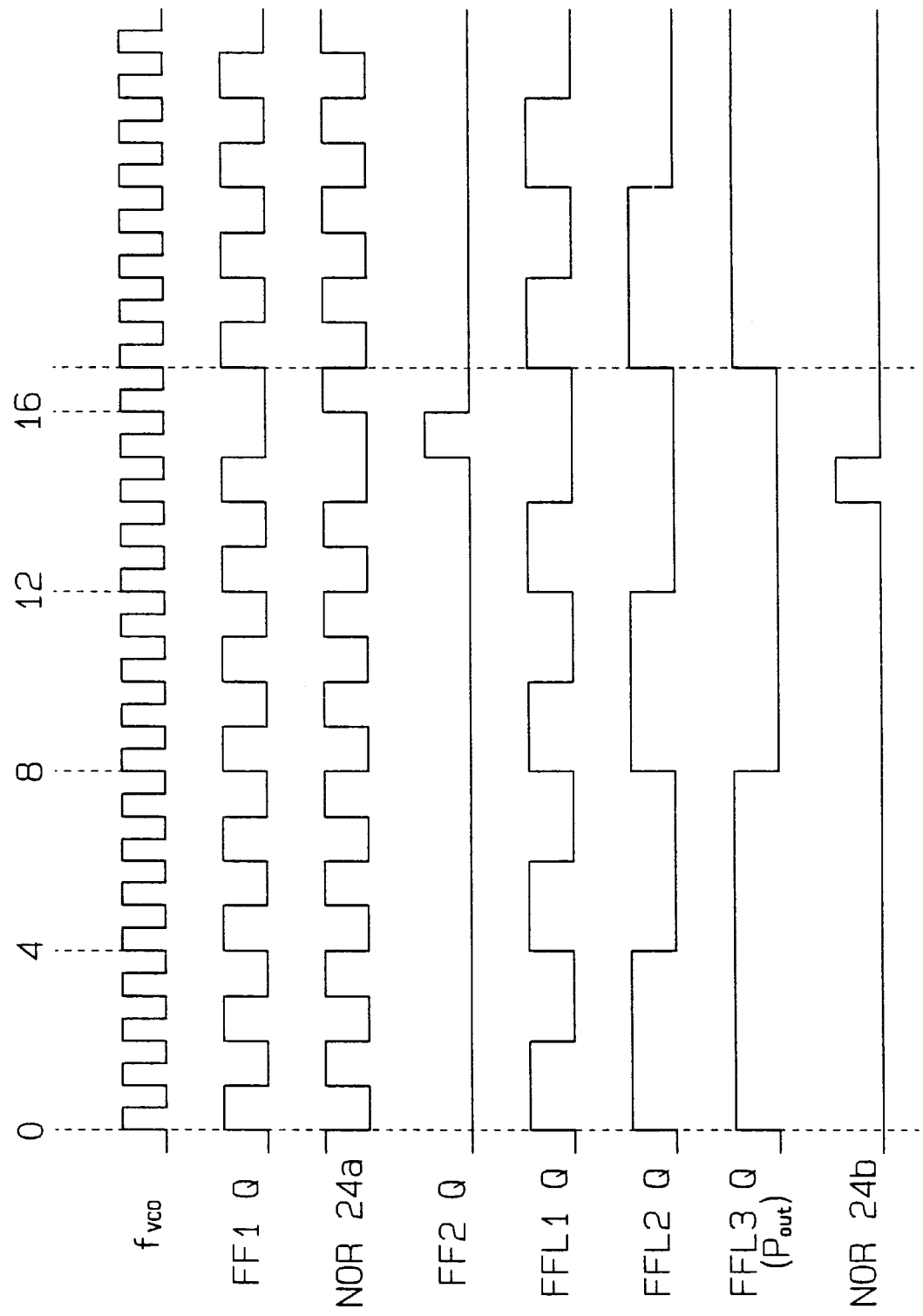
FIG. 11 is a timing chart illustrating the operation of the prescaler of FIG. 10.

A second embodiment of a prescaler 29 in accordance with the present invention will now be described with reference to FIGS. 10 and 11. To avoid the redundant description, like or same reference numerals are given to those components which are the same as the corresponding components of the first embodiment.

The second embodiment differs from the first embodiment only in the structure of the prescaler 19 of the PLL circuit shown in FIG. 4. Accordingly, the following description will be centered on the prescaler 29.

As in the first preferred embodiment, the flip-flop circuits FF1, FF2 and FFL1–FFL3 in the prescaler 29 of the second embodiment comprise of bipolar transistors.

In the second embodiment, the second NOR gate 24b is connected between the flip-flop circuits FF1 and FF2. That is, the XQ output of flip-flop circuit FF1 is provide to the second NOR gate 24b. The second NOR gate 24b is connected to the data D input of the flip-flop circuit FF2. The flip-flop circuit FF2 provides the first NOR gate 24a with its output signal Q. The flip-flop circuit FF2 does not output the signal XQ in the second embodiment.

The operation of the prescaler 29 will be discussed below with reference to FIG. 11.

When the pulse signal $f_{VCO}$ from the VCO is input to the prescaler 29, the flip-flop circuit FF1 outputs the signal Q which is the pulse signal $f_{VCO}$ frequency-divided by two. The flip-flop circuit FFL1 outputs the signal Q which is the output signal Q of the flip-flop circuit FF1 frequency-divided by two (i.e., the pulse signal $f_{VCO}$ frequency-divided by four). The flip-flop circuit FFL2 outputs the signal Q which is the output signal Q from the flip-flop circuit FFL1 frequency-divided by two(i.e., the pulse signal $f_{VCO}$ frequency-divided by eight). The flip-flop circuit FFL3 outputs the signal Q which is the output signal Q from the flip-flop circuit FFL2 frequency-divided by two (i.e., the pulse signal $f_{VCO}$ frequency-divided by sixteen).

When the module control signal MD is at the L level, the output signal of the second NOR gate 24b is determined by the output signal XQ of the flip-flop circuit FF1 and the output signals Q of the flip-flop circuits FFL1–FFL3. In other words, any one of the output signal XQ of the flip-flop circuit FF1 and the output signals Q of the flip-flop circuits FFL1–FFL3 is set to the H level since the prescaler 19 has started counting the pulse signal $f_{VCO}$ and until it counts fourteen pulses of the pulse signal $f_{VCO}$. This fixes the output signal of the second NOR gate 24b to the L level and thus, the output signal Q of the flip-flop circuit FF2 is fixed to the L level.

When the prescaler 19 counts fourteen pulses of the pulse signal $f_{VCO}$, all of the output signal XQ of the flip-flop circuit FF1 and the output signals Q of the flip-flop circuits FFL1–FFL3 are set to the L level. This sets the output signal of the second NOR gate 24b to the H level. Consequently, when the flip-flop circuit FF2 is clocked, it receives the H level input, then outputs the signal Q, which is the H-level output signal of the second NOR gate 24b delayed by one period of the pulse signal $f_{VCO}$. When the output signal of the flip-flop circuit FF2 is set to the H level, the first NOR gate 24a outputs an L-level signal. Then, the output signal Q of the flip-flop circuit FF1 rises with a delay of one period of the pulse signal $f_{VCO}$ from the rising of the output signal of the first NOR gate 24a (the falling of the output signal Q of the flip-flop circuit FF2). In response to the rising of the output signal Q of the flip-flop circuit FF1, the output signals Q of the flip-flop circuits FFL1–FFL3 go high, and a new counting operation is initiated.

Through the above operation, when the module control signal MD is at the L level, the prescaler 19 outputs the frequency-divided signal $P_{out}$ which is equal to the pulse signal $f_{VCO}$ divided by M+1 (M=16). With the module control signal MD being at the H level, the output signal of the second NOR gate 24b is fixed at the L level. This disables the operation of the flip-flop circuit FF2, setting its output signal Q to the L level. As a result, the flip-flop circuit FF1 performs the normal operation and outputs the signal Q which is the pulse signal $f_{VCO}$ frequency-divided by two.

When the module control signal MD is at the H level, the prescaler 19 outputs the frequency-divided signal $P_{out}$ which is equal to the pulse signal divided $f_{VCO}$ by M (M=16).

As apparent from the above, the prescaler 29 of the second embodiment perform the same frequency-dividing operation as that of the first embodiment, and thus has the same advantages as the first embodiment.

Third Embodiment

Figure 12:
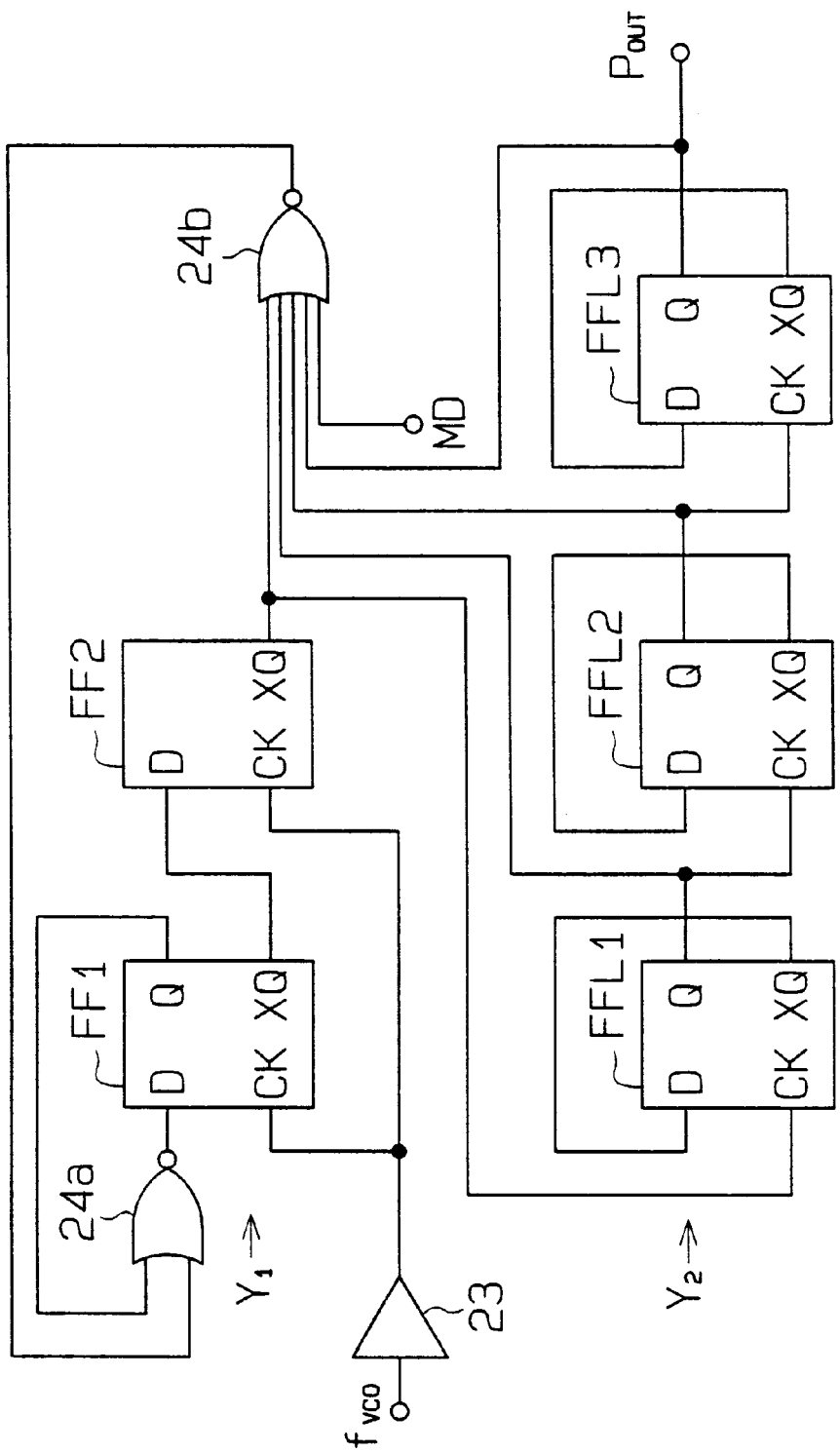
FIG. 12 is a circuit diagram illustrating a prescaler according to a third embodiment.

A third embodiment of a prescaler 39 according to the present invention will now be described with reference to FIGS. 12 through 14. The third embodiment differs from the first embodiment only in the structure of the prescaler 39 of the PLL circuit illustrated in FIG. 4. Accordingly the following discussion will mainly discuss the structure of the prescaler 39.

Like the previous embodiments, the flip-flop circuits FF1, FF2 and FFL1–FFL3 in the prescaler 39 of the third embodiment comprise bipolar transistors.

In the first embodiment, the flip-flop circuit FFL1 receives the signal Q from the flip-flop circuit FF1 as its clock signal CK. By contrast, the flip-flop circuit FFL1 in the third embodiment receives the signal XQ from the flip-flop circuit FF2 as the clock signal CK.

Figure 13:
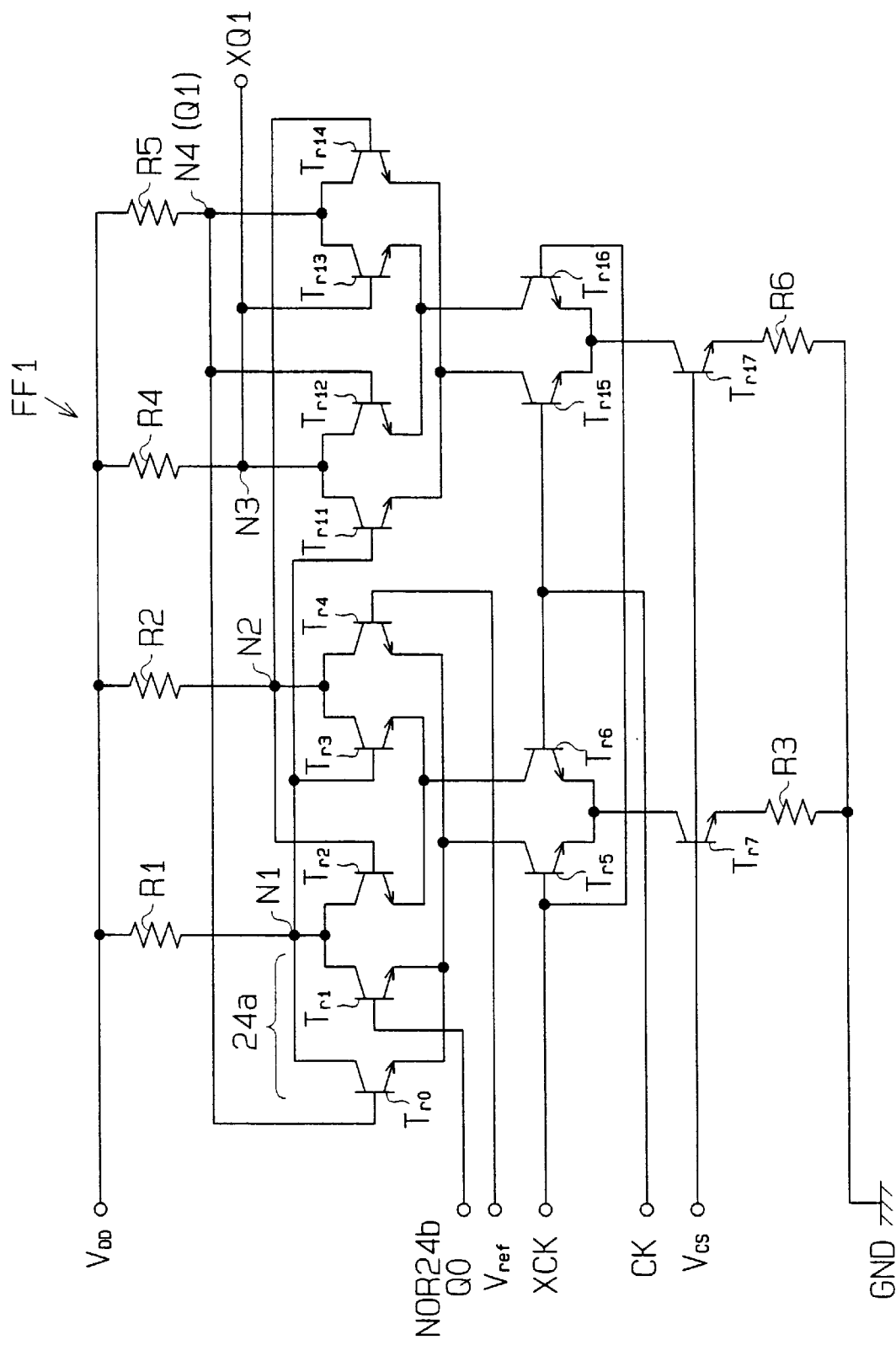
FIG. 13 is a detailed circuit diagram of a flip-flop circuit FF1 and a NOR gate.
Figure 14:
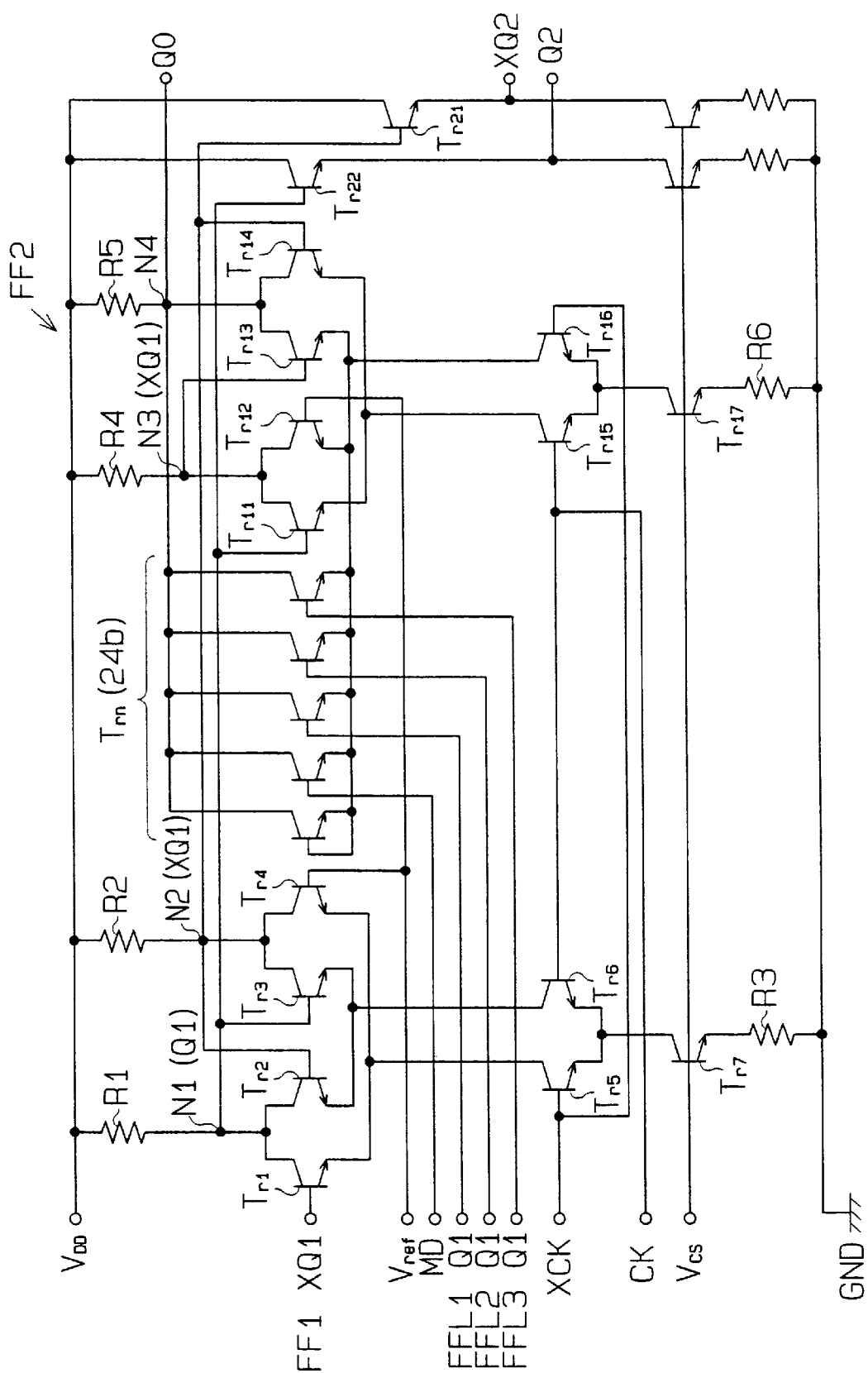
FIG. 14 is a detailed circuit diagram of a flip-flop circuit FF2 and a NOR gate.

Referring now to FIGS. 13 and 14, the specific structures of the individual circuits of the prescaler 39 will be discussed. FIG. 13 shows the flip-flop circuit FF1 and the first NOR gate 24a. FIG. 14 shows the flip-flop circuit FF2 and the second NOR gate 24b. The flip-flop circuits FFL1, FFL2 and FFL3) have the same structure as shown in FIG. 8.

As shown in FIG. 13, the flip-flop circuit FF1 and the first NOR gate 24a include a plurality of transistors and resistors. However, the flip-flop circuit FF1 and the first NOR gate 24a in the third embodiment, unlike those shown in FIG. 6, do not use the transistors $T_{r21}$ and $T_{r22}$ respectively connected to the nodes N3 and N4.

In the thus constituted flip-flop circuit FF1 and first NOR gate 24a, when the clock signal CK rises to the H level from the L level, the output signal of the first NOR gate 24a (the potential at the node N1) is output as the output signal Q (Q1) of the flip-flop circuit FF1 from the node N4. The inverted signal of the signal from the first NOR gate 24a is sent out from the node N3 as the output signal XQ (XQ1). The output signal Q (Q1) of the flip-flop circuit FF1 and the output signal of the first NOR gate 24a, as shown in FIG. 9, are acquired in this manner.

As shown in FIG. 14, the flip-flop circuit FF2 and second NOR gate 24b likewise comprise a plurality of transistors and resistors. The flip-flop circuit FF2 outputs the output signals Q1 and XQ1 from the nodes N1 and N2, respectively. The difference from the flip-flop circuit FF2 and second NOR gate 24b shown in FIG. 7 is that the output signal XQ1 output from the node N2 causes the transistor $T_{r21}$, which is an emitter follower, to operate and the signal XQ1 is sent out of the flip-flop circuit FF2 as an amplified output signal XQ2. Likewise, the output signal Q1 output from the node N1 causes the transistor $T_{r22}$, which is an emitter follower, to operate and is the signal Q1 sent out of the flip-flop circuit FF2 as an amplified output signal Q2. The amplified output signals Q2 and XQ2 are input to the flip-flop circuit FFL1 as the clock signals CK and XCK.

In the prescaler 39, the output signal XQ of the flip-flop circuit FF2 and the output signal Q of the flip-flop circuit FF1 vary similarly, so that the prescaler 39 operates in the same manner as the first prescaler 19 of the embodiment, shown in FIG. 9.

The prescaler 39 performs the same frequency-dividing operation as that of the prescaler 19, and thus has the same advantages as the first embodiment.

It should be apparent to those skilled in the art that the present invention may be embodied in many other specific forms without departing from the spirit or scope of the invention. Particularly, it should be understood that the invention may be embodied in the following forms.

The extender section $Y_2$ comprises the three-stage flip-flop circuits FFL1–FFL3 in each of the embodiments. However, the number of stages may be changed to properly alter the frequency-dividing ratio.

The first and second NOR gates 24a and 24b share the current sources (the supply voltage $V_{DD}$) which drive the flip-flop circuits FF1 and FF2 in each embodiment described above. However, separate power sources may be provided for the NOR gates 24a and 24b. The NOR gates 24a and 24b comprise the switching circuit in each of the embodiments. However, the switching circuit may comprise by other logic circuits as long as the frequency-dividing operation is accomplished.

Therefore, the present examples and embodiments are to be considered as illustrative and not restrictive and the invention is not to be limited to the details given herein, but may be modified within the scope and equivalence of the appended claims.

What is claimed is:

1. A prescaler comprising:
    a buffer circuit for amplifying an input signal and for generating an amplified signal;
    a frequency-dividing counter connected to the buffer circuit and having two synchronous flip-flop circuits, for generating a first frequency-divided signal by frequency-dividing the amplified signal by one of two and three;
    a switching circuit, connected to the frequency-dividing counter, for generating, in response to an activated module control signal, a first switching signal used to operate the frequency-dividing counter as a binary counter, and for generating, in response to a deactivated module control signal, a second switching signal used to operate the frequency-dividing counter as a ternary counter; and
    an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits,
    wherein the extender generates the second frequency-divided signal divided by 2n when the frequency-dividing counter generates the first frequency divided signal that is divided by two, and
    wherein the extender generates the second frequency-divided signal frequency-divided by (2n−1) when the frequency-dividing counter generates the first frequency divided signal divided by three.

2. The prescaler according to claim 1, further comprising one common current source for driving the switching circuit and the two synchronous flip-flop circuits of the frequency-dividing counter.

3. The prescaler according to claim 1, wherein the two synchronous flip-flop circuits of the frequency dividing counter are connected to each other and each of the two synchronous flip-flop circuits receive the input signal, and
    wherein one flip-flop circuit is disposed in a first stage and the other flip-flop circuit is disposed in a second stage.

4. The prescaler according to claim 3, wherein the switching circuit fixes a signal input to the flip-flop circuit of the second stage to a deactivated level when the module control signal is an activated level.

5. The prescaler according to claim 4, wherein the switching circuit and the frequency-dividing counter are connected to form a closed loop.

6. The prescaler according to claim 5, wherein the switching circuit includes a first NOR gate and a second NOR gate, and the first and second NOR gates are connected together.

7. The prescaler according to claim 6, wherein the switching circuit generates the first switching signal such that a signal from the flip-flop circuit at the first stage to the flip-flop circuit at the second stage is maintained at an activated level for a predetermined time period when the module control signal is switched to the deactivated level.

8. The prescaler according to claim 5, wherein the switching circuit includes a first NOR gate and a second NOR gate, wherein the first NOR gate is connected to the first stage flip-flop circuit and the second NOR gate is connected between the first and second stage flip-flop circuits.

9. The prescaler according to claim 8, wherein the switching circuit provides the first switching signal to the flip-flop circuit at the first stage such that the flip-flop circuit at the second stage generates the activated signal when the module control signal is switched to the deactivated level.

10. The prescaler according to claim 1, wherein the input signal is a pulse signal having a predetermined frequency.

11. A frequency divider comprising:
    a prescaler which receives an input signal and generates a frequency divided signal therefrom,
    a main counter for generating a first count signal, obtained by further frequency-dividing the frequency-divided signal from the prescaler by a first frequency-dividing ratio;
    a swallow counter for generating a second count signal, obtained by further frequency-dividing the frequency-divided signal by a second frequency-dividing ratio different from the first frequency-dividing ratio; and
    a controller for generating a module control signal in response to the first and second count signals, wherein the prescaler includes:
        a buffer circuit for amplifying an input signal and for generating an amplified signal;
        a frequency-dividing counter connected to the buffer circuit and having two synchronous flip-flop circuits, for generating a first frequency-divided signal by frequency-dividing the amplified signal by one of two and three;
        a switching circuit, connected to the frequency-dividing counter, for generating, in response to the module control signal being active, a first switching signal used to operate the frequency-dividing counter as a binary counter, and for generating, in response to the module control signal being inactive, a second switching signal used to operate the frequency-dividing counter as a ternary counter; and
        an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits,
        wherein the extender generates the second frequency-divided signal divided by 2n when the frequency-dividing counter generates the first frequency divided signal that is divided by two, and
        wherein the extender generates the second frequency-divided signal frequency-divided by (2n−1) when the frequency-dividing counter generates the first frequency divided signal divided by three.

12. The frequency divider according to claim 11, further comprising one common current source for driving the switching circuit and the two synchronous flip-flop circuits of the frequency-dividing counter.

13. The frequency divider according to claim 11, wherein the two synchronous flip-flop circuits of the frequency dividing counter are connected to each other and each of the two synchronous flip-flop circuits receive the input signal, wherein one flip-flop circuit it disposed in a first stage and the other flip-flop circuit is disposed in a second stage.

14. The frequency divider according to claim 13, wherein the switching circuit fixes a signal input to the flip-flop circuit of the second stage to a deactivated level when the module control signal is an activated level.

15. The frequency divider according to claim 14, wherein the switching circuit and the frequency-dividing counter are connected to form a closed loop.

16. The frequency divider according to claim 15, wherein the switching circuit includes a first NOR gate and a second NOR gate, and the first and second NOR gates are connected together.

17. The frequency divider according to claim 16, wherein the switching circuit generates the first switching signal such that a signal from the flip-flop circuit at the first stage to the flip-flop circuit at the second stage is maintained at an activated level for a predetermined time period when the module control signal is switched to the deactivated level.

18. The frequency divider according to claim 15, wherein the switching circuit includes a first NOR gate and a second NOR gate, wherein the first NOR gate is connected to the first stage flip-flop circuit and the second NOR gate is connected between the first and second stage flip-flop circuits.

19. The frequency divider according to claim 18, wherein the switching circuit provides the first switching signal to the flip-flop circuit at the first stage such that the flip-flop circuit at the second stage generates the activated signal when the module control signal is switched to the deactivated level.

20. The frequency divider according to claim 11, wherein the input signal is a pulse signal having a predetermined frequency.

21. A PLL (Phase Locked Loop) circuit comprising:
a reference frequency divider for generating a reference signal by frequency-dividing a reference clock signal;
a phase comparator for comparing a phase of the reference signal with a phase of a comparison signal and for generating a signal in response to the reference signal and the comparison signal;
a charge pump for converting the signal from the phase comparator into a current signal;
a low-pass filter for smoothing the current signal and generating a voltage signal;
a voltage controlled oscillator for generating an oscillation signal having a frequency proportional to the voltage signal from the low-pass filter; and
a comparative frequency divider for frequency-dividing the oscillation signal from the voltage controlled oscillator and generating a resultant, frequency-divided signal as the comparison signal,
the comparative frequency divider comprising:
a prescaler which receives the oscillation signal and generates a frequency-divided signal therefrom;
a main counter for generating a first count signal, obtained by further frequency-dividing the frequency-divided signal from the prescaler by a first frequency-dividing ratio;
a swallow counter for generating a second count signal, obtained by further frequency-dividing the frequency-divided signal from the prescaler by a second frequency-dividing ratio different from the first frequency-dividing ratio; and a controller for generating a module control signal in response to the first and second count signals; and
wherein the prescaler includes:
a buffer for receiving the oscillation signal and generating an amplified signal;
a frequency-dividing counter connected to the buffer circuit and having two synchronous flip-flop circuits, for generating a first frequency-divided signal by frequency-dividing the amplified signal by one of two and three;
a switching circuit, connected to the frequency-dividing counter, for generating, in response to the module control signal being active, a first switching signal used to operate the frequency-dividing counter as a binary counter, and for generating, in response to the module control signal being inactive, a second switching signal used to operate the frequency-dividing counter as a ternary counter; and
an extender, connected to the frequency-dividing counter, for generating a second frequency-divided signal by frequency-dividing the first frequency divided signal by two, the extender including (n−1) (n: a natural number equal to or greater than 2) stages of asynchronous flip-flop circuits,
wherein the extender generates the second frequency-divided signal divided by 2n when the frequency-dividing counter generates the first frequency divided signal that is divided by two, and
wherein the extender generates the second frequency-divided signal frequency-divided by (2n−1) when the frequency-dividing counter generates the first frequency divided signal divided by three.

22. The PLL circuit according to claim 21, further comprising one common current source for driving the switching circuit and the flip-flop circuits of the frequency-dividing counter.

23. The PLL circuit according to claim 21, wherein the two synchronous flip-flop circuits of the frequency dividing counter are connected to each other and each of the two synchronous flip-flop circuits receive the input signal, wherein one flip-flop circuit is disposed in a first stage and the other flip-flop circuit is disposed in a second stage.

24. The PLL circuit according to claim 23, wherein the switching circuit fixes a signal input to the flip-flop circuit of the second stage to a deactivated level when the module control signal is an activated level.

25. The PLL circuit according to claim 24, wherein the switching circuit and the frequency-dividing counter are connected to form a closed loop.

26. The PLL circuit according to claim 25, wherein the switching circuit includes a first NOR gate and a second NOR gate, and the first and second NOR gates are connected together.

27. The PLL circuit according to claim 26, wherein the switching circuit generates the first switching signal such that a signal from the flip-flop circuit at the first stage to the flip-flop circuit at the second stage is maintained at an activated level for a predetermined time period when the module control signal is switched to the deactivated level.

28. The PLL circuit according to claim 25, wherein the switching circuit includes a first NOR gate and a second NOR gate, wherein the first NOR gate is connected to the first stage flip-flop circuit and the second NOR gate is connected between the first and second stage flip-flop circuits.

29. The PLL circuit according to claim 28, wherein the switching circuit provides the first switching signal to the flip-flop circuit at the first stage such that the flip-flop circuit at the second stage generates the activated signal when the module control signal is switched to the deactivated level.

30. The PLL circuit according to claim 21, wherein the input signal is a pulse signal having a predetermined frequency.

* * * * *